United States Patent [19]

Anjum et al.

[11] Patent Number: 5,401,674
[45] Date of Patent: Mar. 28, 1995

[54] GERMANIUM IMPLANT FOR USE WITH ULTRA-SHALLOW JUNCTIONS

[75] Inventors: Mohammed Anjum; Ibrahim Burki, both of Austin; Craig W. Christian, Buda, all of Tex.

[73] Assignee: Advanced Micro Devices, Sunnyvale, Calif.

[21] Appl. No.: 258,330

[22] Filed: Jun. 10, 1994

[51] Int. Cl.$^6$ .................. H01L 21/265; H01L 21/283
[52] U.S. Cl. ...................... 437/190; 437/24; 437/192; 437/200; 437/933; 148/DIG. 19; 148/DIG. 32; 148/DIG. 34; 148/DIG. 58
[58] Field of Search .............. 437/200, 24, 27, 190, 437/192, 933, 950; 148/DIG. 19, DIG. 32, DIG. 34, DIG. 58; 257/751, 757

[56] References Cited

U.S. PATENT DOCUMENTS

| | | | |
|---|---|---|---|
| 4,558,507 | 12/1985 | Okabayashi et al. | 437/200 |
| 4,683,645 | 8/1987 | Naguib et al. | 437/41 |
| 4,830,971 | 5/1989 | Shibata | 437/29 |
| 4,835,112 | 5/1989 | Pfiester et al. | 437/24 |
| 5,108,954 | 4/1992 | Sandhu et al. | 437/200 |

OTHER PUBLICATIONS

Ashburn, S. P., et al., "Formation of Titanium and Cobalt . . . ", *J. Electronic Materials*, vol. 21, No. 1, 1992, pp. 81–86.

Dehm, C., et al., "Shallow titanium—silicided p$^+$n . . . ", *Appl. Phys. Lett.*, 60(10), 9 Mar. 1992, pp. 1214–1216.

Pfiester, J. R., et al., "A Novel 0.5-$\mu$m n$^\pm$p$^+$Poly . . . ", *IEEE Trans. Elec. Dev.*, vol. 36, No. 11, Nov. 1989, pp. 2422–2432.

Agnello, P. D., et al., "Titanium Silicide/Germanide Formation . . . ", J. Electronic Materials, vol. 23, No. 4, 1994, pp. 413–421.

*Primary Examiner*—T. N. Quach
*Attorney, Agent, or Firm*—Kevin L. Daffer

[57] ABSTRACT

A method is provided for reducing growth of silicide and the temperatures necessary to produce silicide. Germanium is implanted at a concentration peak density depth below the midline and above the lower surface of a metal layer receiving the implant. Subsequent anneal causes germanide to occupy an area above growing silicide such that consumption of silicon atoms is reduced, and that silicide is formed to a controlled thickness.

14 Claims, 3 Drawing Sheets

GERMANIUM IMPLANT FOR USE WITH ULTRA-SHALLOW JUNCTIONS

BACKGROUND OF THE INVENTION

1. Field of the Invention

This invention relates to integrated circuit manufacture and more particularly to multi-layered contact structures using germanide as a way in which to lower resistivity and control growth of silicide over an ultra-shallow junction.

2. Background of the Relative Art

An integrated circuit is by definition a number of electrically interconnected circuit elements defined on the same substrate or "chip". Some of the interconnections are done in the silicon substrate itself, but most are done my means of thin conductive strips running across the top surface of the substrate. Each strip is often connected within a contact area to underlying semiconductor materials (often referred to as "junctions"). Contact to junctions must be of low resistivity and is generally as low as a few micro ohms per square centimeter of contact area.

The conductive strips are usually made of aluminum or aluminum alloy, and, in some instances, can have silicon placed therein. Aluminum adheres well to silicon dioxide and has low contact resistance, but may suffer numerous problems, such as, for example, a propensity to grow "spikes".

In ultra-shallow regions (i.e., junctions having a thickness less than, for example, 1,000 angstroms), aluminum may spike completely through the underlying junction at the contact area. To prevent spiking, the contact structure must be altered with, for example, a sacrificial, passive or stuffed barrier material. The barrier material resides between the aluminum and underlying silicon. A popular barrier comprises titanium nitride, wherein the nitride stuffs the grain boundaries of the titanium thereby preventing a substantial amount of silicon diffusion into the overlying aluminum from the junction region. As the junction region becomes shallower in accordance with modern day technologies, it is important the barrier remain configured between the underlying silicon and overlying aluminum. However, the barrier must be formed in a low-temperature ambient so as to not further deepen the shallow junction region.

Along with barrier materials, the contact structures further include steps for lowering the contact resistance at the interconnect/silicon juncture. Specifically, most manufactures utilize a silicide formed at the juncture. The silicide helps break through the residual surface oxide so that good electrical contact can be made. Applying heat necessary for silicidation is sometimes required to adjust the silicon dioxide—silicon interface states. Silicides are made by depositing a thin layer of metal over the entire wafer, heating the wafer to a high enough temperature for the silicon and metal to react in the contact window areas and then etching away the unreacted metal on top of the oxide. Most metals used to form silicide are transition or refractory metals in group IV(B), V(B) and VI(B).

By depositing a refractory metal, such as titanium, across the wafer and then heating the titanium, it reacts with underlying silicon to form a silicide. Simultaneously, nitrogen atoms are inserted into the upper surface of the titanium to stuff the grain boundaries and provide barrier functionality. For this reason, titanium provides suitable properties for both silicide and barrier formation in a single anneal step. Unfortunately, the advent of ultra-shallow junctions has lead to many constraints on the silicidation of titanium. First, conventional processes require an anneal greater than approximately 800° C. to form titanium silicide ($TiSi_2$). Any temperature less than 800° C. can produce non-stoichiometric silicide leading to greater sheet resistance in the contact area. However, at more suitable silicide temperatures approaching 800° C., highly mobile boron dopants within the junction diffuse at greater diffusion lengths causing a deepening of the junction. Deepening of the junction can result in greater parasitic source/drain capacitance and lower breakdown voltages. Additionally, driving away of boron impurities from the surface area to deeper positions can increase the contact and sheet resistance in the contact area. Still further, increased heat can cause boron to diffuse along with silicon atoms into the growing silicide and further deplete boron at the silicon surface (adjacent the lower edge of silicide). Boron depletion caused by high temperature processing or by silicide-induced consumption must be minimized.

It is also important that the silicide be grown to a controlled thickness. If the silicide film becomes too thick, defects can occur at the edge of the silicide film due to stresses in the film. Such defects are reported to begin occurring once the thickness of the silicide film exceeds approximately 100 nm. The mechanism for growing silicide is generally understood as species of silicon diffusing from the underlying substrate surface to the overlying (and abutting) titanium. If an excessive amount of silicon atoms are allowed to diffuse, then the silicide is made too thick causing undo stresses in the film. It is therefore important not only to minimize the silicide growth temperature, but also to prevent excessive silicon consumption during the growth process. It is important that the integrity of the boron atoms, once placed, remain in their position to maintain the ultra-shallow junction region and the advantages thereof.

The above problems generally present themselves whenever titanium is used as the base silicide metal, and the underlying junction is p-type, highly mobile boron atoms. While use of titanium presents many problems, there remains many advantages of titanium. Titanium is a mainstay and essential component in modern contact structures. Nitrogen-doped titanium has high quality stuffed barrier properties. Titanium juncture to underlying silicon forms low resistance silicide—an important feature of all contact structures. While it would be advantageous to continue utilizing titanium silicide and the nitrogen-stuffed titanium barrier, it would be further advantageous to utilize such materials with modern day ultra-shallow junctions. Specifically with junctions that have highly mobile boron atoms therein.

SUMMARY OF THE INVENTION

The problems outlined above are in large part solved by the contact structure and manufacturing process of the present invention. That is, the contact structure hereof utilizes germanium ions implanted at a carefully chosen depth within a CVD or sputter deposited titanium material. The germanium atoms reside at a depth which substantially blocks or prevents a large portion of silicon atoms and boron atoms from diffusing or migrating into the growing silicide. Thus, the implant step occurs prior to anneal and is used to minimize out-diffusion of boron, thereby preventing a substantial increase in contact resistance. The germanium atoms also prevent excessive consumption of silicon atoms into the overly titanium during silicide growth. By implanting germanium at a controlled depth within the titanium, a thin layer of titanium silicide is formed at the titanium/silicon interface. The layer is much thinner than conventional titanium silicides and is less susceptible to stresses at the edges of the film and possible spiking through underlying ultra-shallow junctions.

The present contact structure is best suited for ultra-shallow junctions (i.e., junctions of less than 1000 Angstroms and, in some instances, less than 600 Angstroms). Furthermore, the contact structure can be formed at lower temperature anneal and upon highly mobile, long diffusion length impurity species configured within the junction.

Preferably, silicide is formed at temperatures less than 700° C. in a thin layer less than 100 Angstroms. Prevention of excess silicide occurs by germanium blocking underlying silicon migration. Moreover, germanium implanted into the titanium simultaneously forms as titanium germanide ($TiSi_2$) at the same time as titanium silicide is formed. The germanide is formed as a thin layer (preferably less than 100 Angstroms) above the silicide layer to maintain the silicide position during anneal. Both germanide and silicide are formed in stoichiometric proportions with titanium atoms. Moreover, germanide and silicide are formed simultaneous with nitride at the upper surface of the titanium to complete the nitride, germanide and silicide composite contact structure hereof.

Broadly speaking, the present invention contemplates a method for controlling growth of a silicide from a silicon substrate upper surface to an overlying layer of titanium. The method comprises the steps of providing a silicon substrate upper surface and implanting p-type ions into the substrate upper surface to form an ultra-shallow junction region less than 1000 Angstroms in thickness. A layer of titanium is then deposited across the substrate upper surface. The titanium layer has a titanium upper and lower surface wherein the titanium upper surface is exposed and the titanium lower surface is adjacent to the substrate upper surface. Germanium ions are implanted through the exposed titanium upper surface and into the layer of titanium to a concentration peak density at a depth deeper than the midline between the titanium upper and lower surfaces and a depth shallower than the titanium lower surface. In the presence of nitrogen, the titanium layer is heated to react a portion of the titanium lower surface with the substrate upper surface. The reacted portion of titanium and silicon substrate form a titanium nitride barrier layer at the upper surface of the titanium, a titanium silicide layer at the lower surface of the titanium and a titanium germanide layer therebetween.

After the nitride barrier layer, titanium germanide layer and titanium silicide layer are formed, the unreacted portion of the titanium is removed and a conductor is deposited across the titanium nitride barrier layer. The deposited conductor thereby completes an interconnect contact structure in the contact window area to other contact areas placed elsewhere upon the substrate or chip. The conductor is preferably a metal such as aluminum or a combination of aluminum and silicon.

The titanium is preferably heated to a temperature less than 700° C., in a single step without removing the silicon substrate from the chamber. Heating the titanium and underlying substrate causes titanium silicide to grow to a thickness less than 100 Angstroms and the titanium germanide to grow to a thickness less than 100 Angstroms.

BRIEF DESCRIPTION OF THE DRAWINGS

Other objects and advantages of the invention will become apparent upon reading the following detailed description and upon reference to the accompanying drawings in which.

Figure 1:
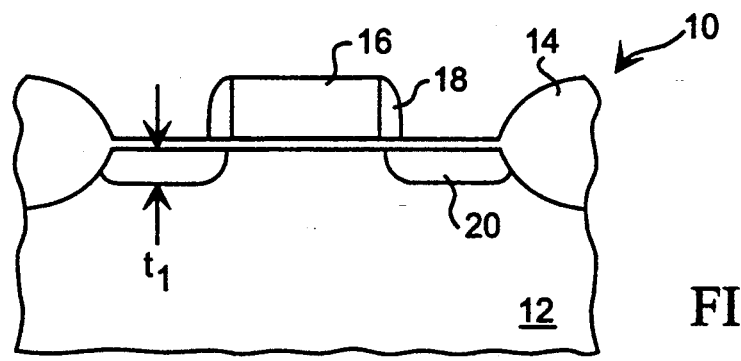
FIG. 1 is a partial cross-sectional view of an integrated circuit formed at an early stage of development according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a partial cross-sectional view of an integrated circuit 10 is shown at an early stage in the development process. Integrated circuit 10 includes a silicon substrate 12, upon which field oxide 14, gate conductor 16 and spacers 18 are formed. Spacers 18 are used in the lightly doped drain (LDD) process. A junction region 20 is implanted in active areas between spacers 18 and field oxide 14. As defined herein, ultra-shallow junction refers to a junction region having a thickness less than 1000 Angstroms. Thus, thickness $t_1$ shown in FIG. 1 of less than 1000 Angstroms is illustrative of an ultra-shallow junction region 20.

Figure 2:
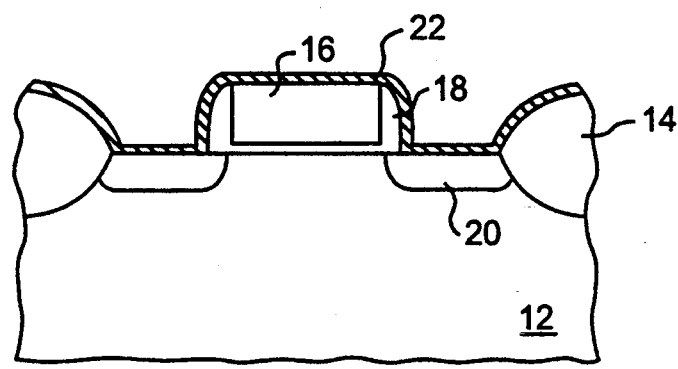
FIG. 2 is a partial cross-sectional view of an integrated circuit formed after deposition of metal according to the present invention.

Referring to FIG. 2, a subsequent processing step is shown in which a metal layer 22 (preferably titanium) is deposited across the entire upper surface. Metal layer 22 can be deposited by sputter deposition from a sputter target of metal or metal alloy. A suitable sputter target comprises titanium sputter deposited onto the upper topography of substrate 12 within a chamber containing an inert species. Preferably, titanium is deposited to a thickness in the range of 250 to 600 Angstroms.

Figure 3:
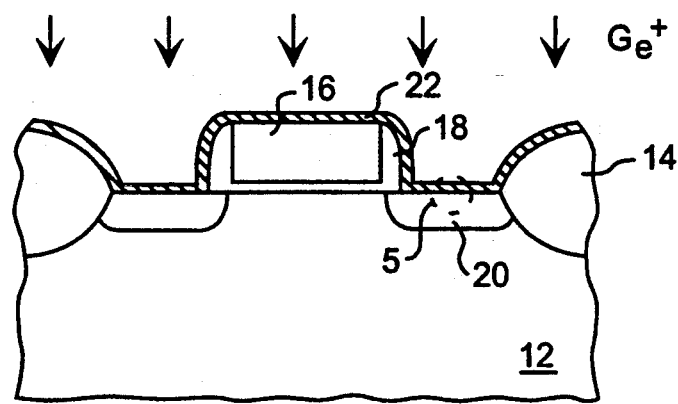
FIG. 3 is a partial cross-sectional view of an integrated circuit formed after germanium implant according to the present invention.
Figure 4:
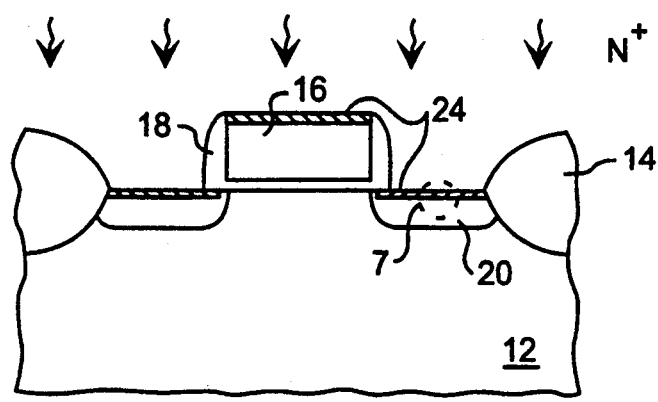
FIG. 4 is a partial cross-sectional view of an integrated circuit formed after anneal (heating cycle) according to the present invention.

After metal layer 22 is deposited, germanium ions are implanted into metal layer 22, as shown in FIG. 3. Germanium ions are implanted prior to anneal. Anneal step is shown in FIG. 4. Relatively large atomic species germanium (atomic weight 73) remain close to their implanted positions within the lower boundaries of metal layer 22.

During subsequent anneal, as shown in FIG. 4, a silicide/germanide layer 24 (including an upper nitride layer if anneal occurs in the presence of nitrogen) is formed during application of anneal temperatures less than approximately 700° C. In areas where silicide and germanide do not form (or do not react), titanium is removed leaving only the silicide/germanide (reacted) areas. The reacted silicide/germanide layers 24 exist primarily at the upper surface of junctions 20 and polysilicon gate 16. Due to lower temperature anneal, "bridging" is substantially prevented in the spacer regions 18 between silicide/germanide regions 24. Furthermore, lower temperature anneal assures junction region 20 does not diffuse to a deeper depth within silicon substrate 12 or into the growing silicide. Still further, pre-implanting germanium helps minimize the consumption of silicon atoms from junction 20 and reduces the growth of ensuing silicide.

Figure 5:
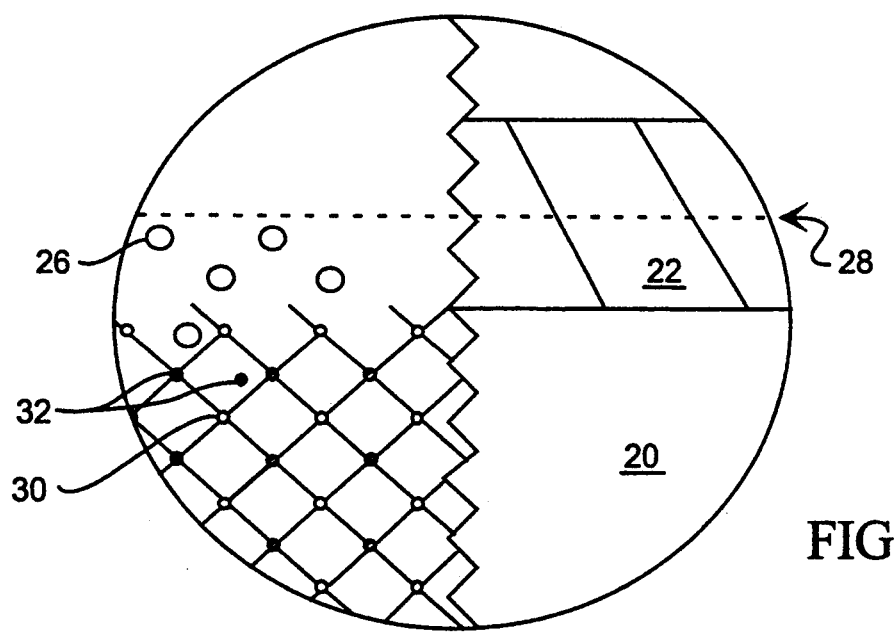
FIG. 5 is a detailed partial breakaway atomic view of area 5 in FIG. 3.
Figure 7:
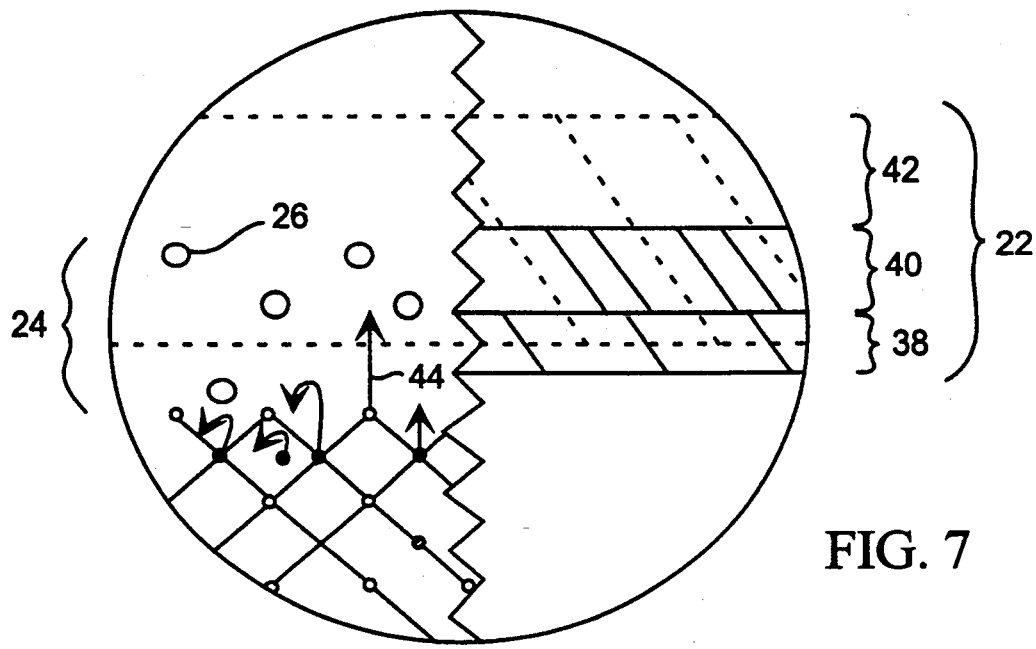
FIG. 7 is a detailed partial breakaway view of area 7 in FIG. 4.
Figure 8:
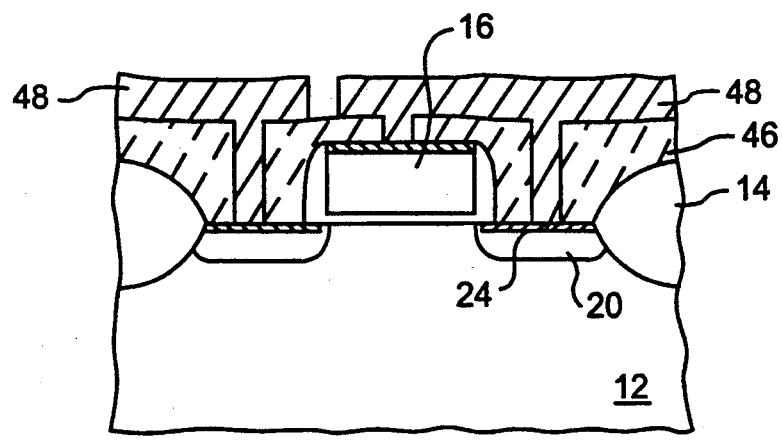
FIG. 8 is a partial cross-sectional view of an integrated circuit formed after overlying interconnect deposition according to the present invention.

The physical characteristics and possible reasons behind the advantages of germanium implantation to reduce silicon and underlying boron consumption are contemplated in reference to detailed atomic views shown in FIGS. 5 and 7. Implantation of germanium can occur at lower temperatures, has less likelihood of oxygen ingress and resulting oxide formation, and has thinner ensuing silicide and germanide than conventional non-implanted techniques. For example, as described in Ashburn, et al., "Formation of Titanium and Cobalt Germanides on Si(100) Using Rapid Thermal Processing", *Journal of Electronic Materials*, Vol. 21 (1992)(herein incorporated by reference), CVD deposition of germanium is accomplished through thermal decomposition of germanium and hydrogen. The addition of hydrogen species can combine with oxygen to form unwanted moisture in the germanide material. Moreover, higher temperature (greater than 750° C.) is required to relieve strain at the edges of the deposited germanium. By implanting, rather than depositing, the present germanide is formed at a more uniform density of germanium atoms across the entire upper topography. Using techniques such as plasma ion immersion, germanium implantation can occur uniformly across the entire upper surface regardless of the topological features. Plasma ion immersion allows implant at low energies, low enough for only a relatively thin titanium to be used. In some instances, titanium can be less than 1000 Angstroms in thickness.

Deposition cannot, in all instances, provide a uniform layer of deposited material. Moreover, removal from sputtering and CVD chambers to achieve dual, conventional titanium and germanium deposition allows ingress of oxygen, moisture, or other contaminants. A single implant step immediately followed by anneal helps minimize the introduction of contaminants into the titanium and/or germanium layers.

Referring to FIG. 5, a detailed partial breakaway atomic view of area 5 in FIG. 3 is shown. Germanium ions 26 are implanted at a depth deeper than the midline 28 between the upper and lower surfaces of metal (titanium) layer 22. Placement of germanium ions 26 substantially below midline 28 and above the lower surface of titanium layer 22 is achieved by medium current implantation devices using, for example, a dose within the range of $5 \times 10^{15}$ to $1 \times 10^{16}$ atoms/cm$^2$ and at an implant energy of approximately 50 keV. At such dosage and energy levels, and assuming titanium layer 22 thickness of approximately 300 Angstroms, the peak concentration density depth (relative to the upper surface of titanium 22) is approximately 250 Angstroms. As with any implantation into a thin film substance, a straggle, or $\Delta R_p$, occurs which, using the exemplary dosage and energies above, is roughly 100 Angstroms. Beyond those purposefully implanted below titanium layer 22, straggle invokes a certain percentage of implanted germanium ions 26 to exist below titanium layer 22 and within junction region 20. It is postulated that germanium ions exist as atomic barriers at diffusion path sites normally taken by underlying silicon atoms 30 and/or boron atoms 32. Occupancy of diffusion sites helps minimize or reduce the diffusion length of highly mobile boron dopants 32 from junction 20 into titanium 22. Moreover, germanium occupancy also helps minimize or reduce the diffusion length or extent of silicon consumption into titanium layer 22. During temperature cycles which occur during anneal, the silicon single crystal material relieves stress by reducing boron diffusion and redirecting boron back to active sites within the crystal material. Further discussion of this characteristic is set forth and described below.

Figure 6:
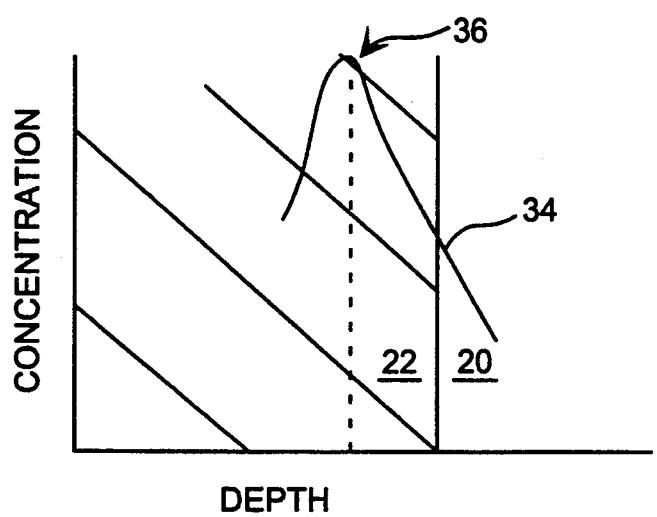
FIG. 6 is a graph of depth versus concentration of germanium atoms within titanium and silicon before anneal according to the present invention.

Referring to FIG. 6, implant profile curve 34 is shown of germanium ions implanted into titanium layer 22 and into the upper surface of junction region 20. A small percentage of germanium ions reside within the upper regions of junction 20. A peak concentration density 36 exists at a depth above the lower edge of titanium layer 22.

Referring now to FIG. 7, a detailed partial breakaway atomic view of area 7 in FIG. 4 is shown. In particular, the lower portion of titanium layer 22 reacts in the presence of an anneal temperature of less than approximately 700° C. to form a reacted region 24. Reacted region 24 comprises a titanium silicide region 38 and a titanium germanide region 40. Titanium germanide region 40 is formed above titanium silicide region 38 due to the presence of germanium ions 26 at a peak concentration density above the lower bounds of titanium 22. The unreacted portion 42 of titanium layer 22 is removed in a subsequent etch process. The etch process removes only the unreacted titanium 42 and does not react with or remove the germanide or silicide formed therebelow.

Use of germanium ions 26 ensures that diffusion length of boron, referenced as numeral 44, is shortened. Diffusion length 44 is shortened by an amount approximately equal to the closeness of concentration peak density depth 36 to the lower surface of titanium layer 22. Thus, the closer depth 36 is to the lower surface of titanium layer 22, the shorter the diffusion length 44 is. By controlling implant dosage and energy, concentration peak density 36 can be maintained at a depth which can purposefully control diffusion length 44 and, thereby, the thickness of titanium silicide 38. It is contemplated that the maximum distance in which silicon or boron atoms can migrate into titanium 22 is approximately equal to the lower surface of titanium germanide layer 40. Accordingly, the presence of germanide minimizes silicide growth yet maintains low resistivity within the germanide layer itself.

To complete interconnect contact and the contact structure hereof, a contact window is formed through dielectric layer 46. Layer 46 electrically isolates the topography from an overlying conductor 48. Conductor 48 extends through the contact window, and therefore through layer 46 to the underlying silicide 24. Silicide 24 is annealed in the step shown in FIG. 4 in the presence of a nitrogen ambient to form a TiN barrier near the upper surface of silicide 24. Thus, the contact structure hereof comprises the following layers arranged from the uppermost to the lowermost regions: Al—TiN—TiGe$_2$—TiSi$_2$—Si.

It will be appreciated to those skilled in the art having the benefit of this disclosure that this invention is believed to be capable of applications with any integrated circuit requiring low resistivity contact structure, and that multiple levels of interconnect can be formed with dielectric structures between each level. Furthermore, it is also to be understood that the form of the invention shown and described is to be taken as an exemplary presently preferred embodiment. Various modifications and changes may be made to each and every processing step as would be obvious to a person skilled in the art without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A method for controlling growth of silicide from a silicon substrate upper surface to an overlying layer of titanium, the method comprising the steps of:
   providing a silicon substrate upper surface and implanting p-type ions into said substrate upper surface to form an ultra shallow junction region less than 1000 Angstroms in thickness;
   sputter depositing a layer of titanium across said substrate upper surface, said titanium layer having a titanium upper and lower surface wherein the titanium upper surface is exposed and the titanium lower surface is adjacent said substrate upper surface;
   implanting germanium ions into said layer of titanium to a concentration peak density at a depth deeper than the midline between the titanium upper and lower surfaces and at a depth shallower than the titanium lower surface; and
   heating in the presence of nitrogen to react a portion of the titanium lower surface with said substrate upper surface to form a titanium nitride barrier layer, a titanium silicide layer and a titanium germanide layer, wherein said titanium nitride barrier layer is formed above said titanium germanide layer and said titanium germanide layer is formed above said titanium silicide layer.

2. The method as recited in claim 1, further comprising the steps of:
   removing the unreacted portion of said titanium layer; and
   sputter depositing a conductor across said titanium silicide layer to complete an interconnect contact structure.

3. The method as recited in claim 1, wherein said implanting step comprises inserting germanium ions into said layer of titanium at a dose of $5 \times 10^{15} - 1 \times 10^{16}$ atoms/cm$^2$ and at an energy of approximately 50 keV, wherein the concentration peak density is at a depth of 250 Angstroms relative to the titanium upper surface.

4. The method as recited in claim 1, wherein said implanting step comprises inserting germanium ions into said layer of titanium at a dose of $5 \times 10^{15} - 1 \times 10^{16}$ atoms/cm$^2$ and at an energy of approximately 50 keV to achieve a range straggle, $\Delta R_p$, of approximately 100 Angstroms.

5. The method as recited in claim 1, wherein said heating step comprises inserting said silicon substrate into a chamber and heating the chamber to a temperature less than 700° C.

6. The method as recited in claim 1, wherein said heating step comprises inserting said silicon substrate into a chamber and, in a single step and without removing said silicon substrate from said chamber, heating the chamber to a temperature less than 700° C.

7. The method as recited in claim 1, wherein said heating step comprises inserting said silicon substrate into a chamber, filling said chamber with a nitrogen ambient, and heating said substrate.

8. A method for growing a titanium silicide of less than 100 Angstroms in thickness and at temperature less than 700° C. while maintaining an underlying junction thickness less than 1000 Angstroms, the method comprising the steps of:
   implanting boron ions as boron atoms into a substrate upper surface of regularly arranged silicon atoms to form a junction region less than 1000 Angstroms below said upper surface;
   sputter depositing a layer of titanium across said substrate upper surface, said titanium layer having a titanium upper and lower surface wherein the titanium upper surface is exposed and the titanium lower surface is adjacent said substrate upper surface;
   implanting germanium ions into said layer of titanium to a concentration peak density at a depth deeper than a midline between the titanium upper and lower surfaces and at a depth shallower than the titanium lower surface; and
   heating said layer of titanium to react a portion of the titanium lower surface with said substrate to form a titanium germanide layer less than 100 Angstroms in thickness abutting against the upper surface of a titanium silicide layer less than 100 Angstroms in thickness, wherein a substantial majority of silicon and boron atoms within said substrate upper surface comprise a diffusion length less than 100 Angstroms during said heating step.

9. The method as recited in claim 8, further comprising the steps of:
   removing the unreacted portion of the titanium layer; and
   sputter depositing a conductor across said titanium silicide layer to complete an interconnect contact structure.

10. The method as recited in claim 8, wherein said implanting step comprises inserting germanium ions into said layer of titanium at a dose of $5 \times 10^{15} - 1 \times 10^{16}$ atoms/cm$^2$ and at an energy of approximately 50 keV, wherein the concentration peak density is at a depth of 250 Angstroms relative to the titanium upper surface.

11. The method as recited in claim 8, wherein said implanting step comprises inserting germanium ions into said layer of titanium at a dose of $5 \times 10^{15} - 1 \times 10^{16}$ atoms/cm$^2$ and at an energy of approximately 50 keV to achieve a range straggle, $\Delta R_p$, of approximately 100 Angstroms.

12. The method as recited in claim 8, wherein said heating step comprises inserting said silicon substrate into a chamber and heating the chamber to a temperature less than 700° C.

13. The method as recited in claim 8, wherein said heating step comprises inserting said silicon substrate into a chamber and, in a single step and without removing said silicon substrate from said chamber, heating the chamber to a temperature less than 700° C.

14. The method as recited in claim 8, wherein said heating step comprises inserting said silicon substrate into a chamber, filling said chamber with a nitrogen ambient, and heating said substrate.

* * * * *